United States Patent
Lai

(10) Patent No.: US 6,488,523 B1
(45) Date of Patent: Dec. 3, 2002

(54) CONDUCTIVE MEMBER OF ZERO INSERTION/EXTRACTION FORCE INTEGRATED CIRCUIT SOCKET

(76) Inventor: Kuang-Chih Lai, No. 2, Lane 10, Sheng-Li Street, Tu-Cheng City, Taipei Hsien (TW)

(*) Notice: Subject to any disclaimer, the term of this patent is extended or adjusted under 35 U.S.C. 154(b) by 0 days.

(21) Appl. No.: 09/964,559

(22) Filed: Sep. 28, 2001

(51) Int. Cl.[7] .................................. H01R 13/625
(52) U.S. Cl. ........................ 439/342; 439/885
(58) Field of Search .................. 439/885, 342

(56) References Cited

U.S. PATENT DOCUMENTS 4,712,299 A * 12/1987 Loewen et al. .............. 439/885
5,188,546 A * 2/1993 Ballard et al. .............. 439/885
5,452,512 A * 9/1995 Foley et al. ................. 439/885

\* cited by examiner

Primary Examiner—Gary Paumen
(74) Attorney, Agent, or Firm—Rosenberg, Klein & Lee

(57) ABSTRACT

A conductive member of zero insertion/extraction force integrated circuit socket, including spring sections and contact sections is provided. The spring sections and contact sections of the conductive members are interlaced with each other and arranged on the blank. The unfolding pitch of the blank is equal to the insertion pitch, whereby a maximum utility ratio of the blank is achieved and the conductive members, made by punching the same blank, can be fully inserted into the same row of insertion holes of the insulating seat body at the same time during the insertion operation.

25 Claims, 11 Drawing Sheets

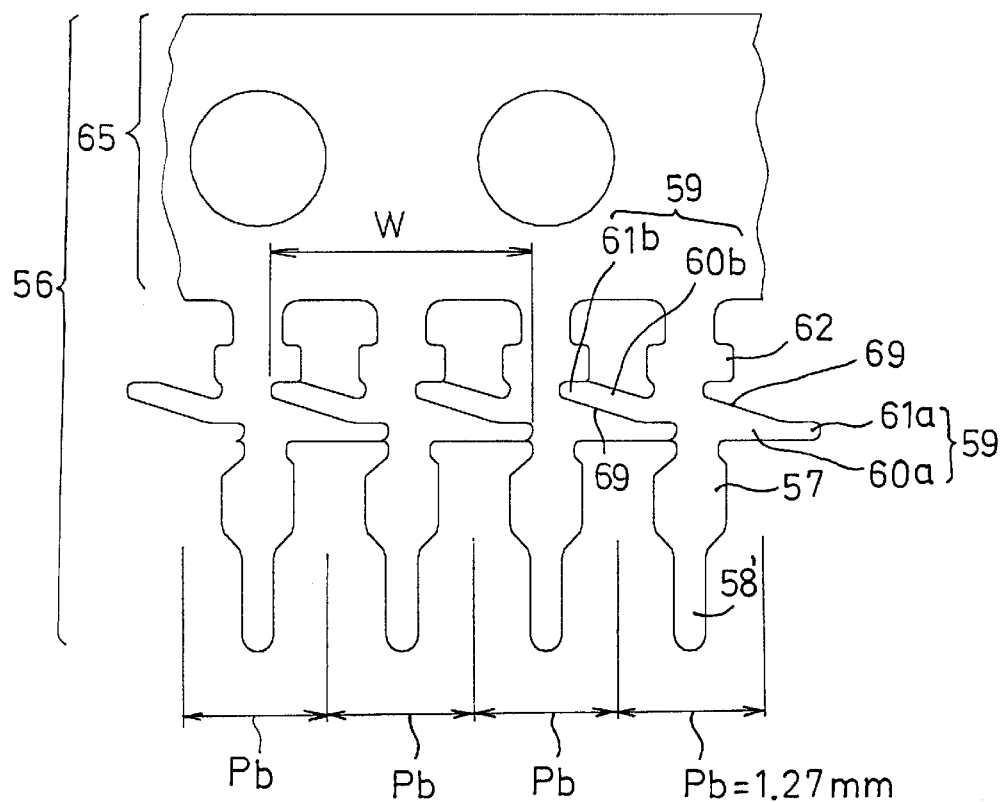
Fig. 4
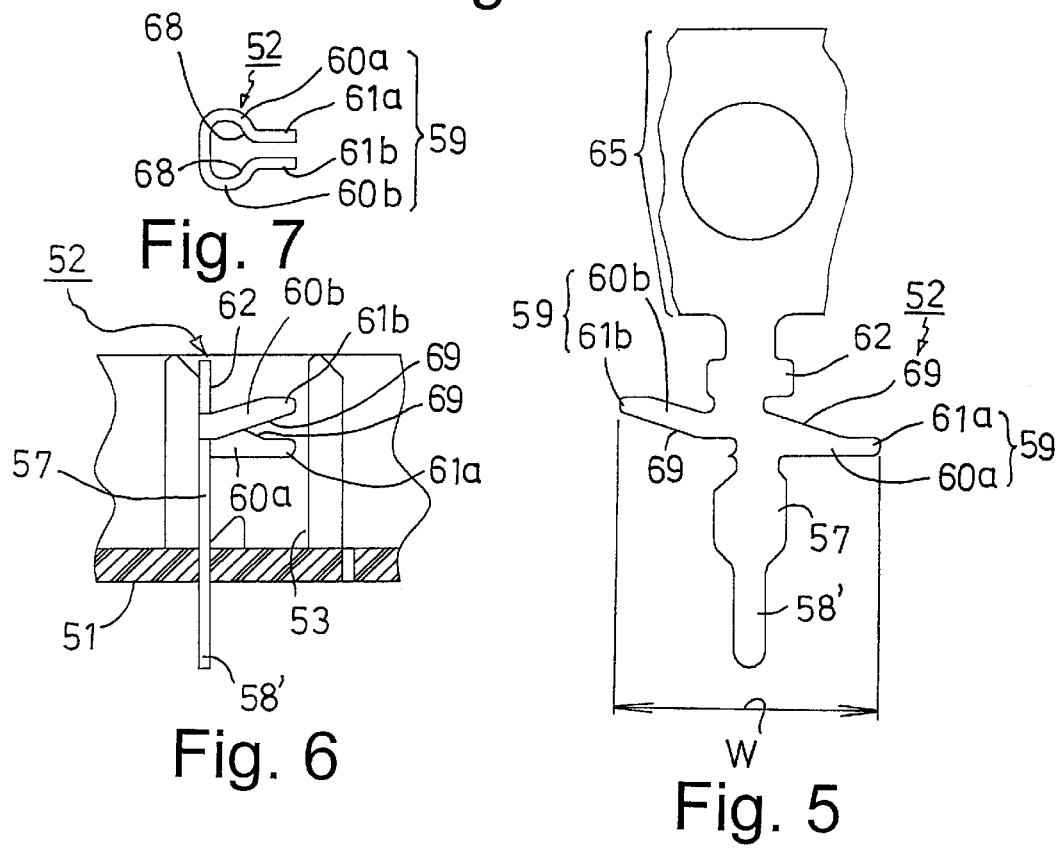
Fig. 7
Fig. 6
Fig. 5

CONDUCTIVE MEMBER OF ZERO INSERTION/EXTRACTION FORCE INTEGRATED CIRCUIT SOCKET

BACKGROUND OF THE INVENTION

Field of the Invention

The present invention is related to conductive members of zero insertion/extraction force integrated circuit sockets, which utilize the production blank optimally. The conductive members are made by punching the same blank and can be fully inserted into the same row of insertion holes of the insulating seat body during the insertion operation.

In order to facilitate replacement and progress, an integrated circuit, including a central processor unit (CPU), is generally indirectly electrically connected with a printed circuit board via an integrated circuit socket soldered on the printed circuit board. A conventional integrated circuit socket includes an insulating seat body and multiple conductive members. The insulating seat body is formed with multiple insertion holes. The distance between each two adjacent insertion holes is defined as an insertion pitch. According to the updated specification regulated by U.S. major manufacturers, the pitch of the insertion pins of integrated circuit is 1.27 mm. As shown in FIGS. 37, 38 and 39, such a pitch is very small so that it is impossible to make effective conductive members on a metal blank at each conventional interval of 1.27 mm. In addition, it is impossible to manufacture such a conductive member A having two opposite spring sections B and contact sections C for clamping the insertion pin of the integrated circuit which are formed on two sides of the conductive member. When unfolded, the spring sections and contact sections are wider than 1.27 mm. Therefore, it is impossible to cut the blank within 1.27 mm to form spring sections and contact sections wider than 1.27 mm.

Therefore, generally, a complete conductive member is made at two insertion pitches P, that is, P=2.54 mm. However, this leads to two problems as follows:
1. The pitch of the punched row of conductive members is 2.54 mm, while the pitch of the insertion holes of the insulating seat body is 1.27 mm. Therefore, twice the number of insertion operations are required to fully insert the conductive members into the entire row of insertion holes of the insulating seat body. As a result, manufacturing time is doubled.
2. The utility ratio of the blank is low. A width of 1.27 mm is inevitably wasted.

SUMMARY OF THE INVENTION

It is therefore a primary object of the present invention to provide a conductive member of zero insertion/extraction force integrated circuit socket. A complete conductive member can be cut within each 1.27 mm pitch. That is, the unfolding pitch of the entire row of conductive members is 1.27 mm. Accordingly, the conductive members, made by punching the same blank, can be fully inserted into the same row of insertion holes of the insulating seat body at the same time during the insertion operation.

It is a further object of the present invention to provide the above conductive member of zero insertion/extraction force integrated circuit socket in which a complete conductive member can be cut within each 1.27 mm pitch so that a maximum utility ratio of the blank is achieved.

It is still a further object of the present invention to provide the above conductive member of zero insertion/extraction force integrated circuit socket in which each of the contact sections of any conductive member has a first slope which first contacts with the insertion pin of the integrated circuit. The first slope serves to guide the insertion pin to more easily insert into the space between the opposite contact sections.

It is still a further object of the present invention to provide the above conductive member of zero insertion/extraction force integrated circuit socket in which each of the contact sections of any conductive member has a second slope which further contacts the insertion pin of the integrated circuit. The second slope serves to prevent the insertion pin from slipping out of the space between the contact sections, whereby the insertion pin of the integrated circuit is more firmly clamped and fixed.

The present invention can be best understood through the following description and accompanying drawings wherein:

BRIEF DESCRIPTION OF THE DRAWINGS

FIG. 4 is a plane view showing that the first embodiment of the conductive members are made by punching a blank;

FIG. 5 shows one single conductive member taken from FIG. 4;

FIG. 6 is a sectional view showing that the conductive member of FIG. 5 is inserted in the insulating socket;

FIG. 7 is a top view of the first embodiment of the conductive member according to FIG. 6;

DETAILED DESCRIPTION OF THE PREFERRED EMBODIMENTS

Figure 1:
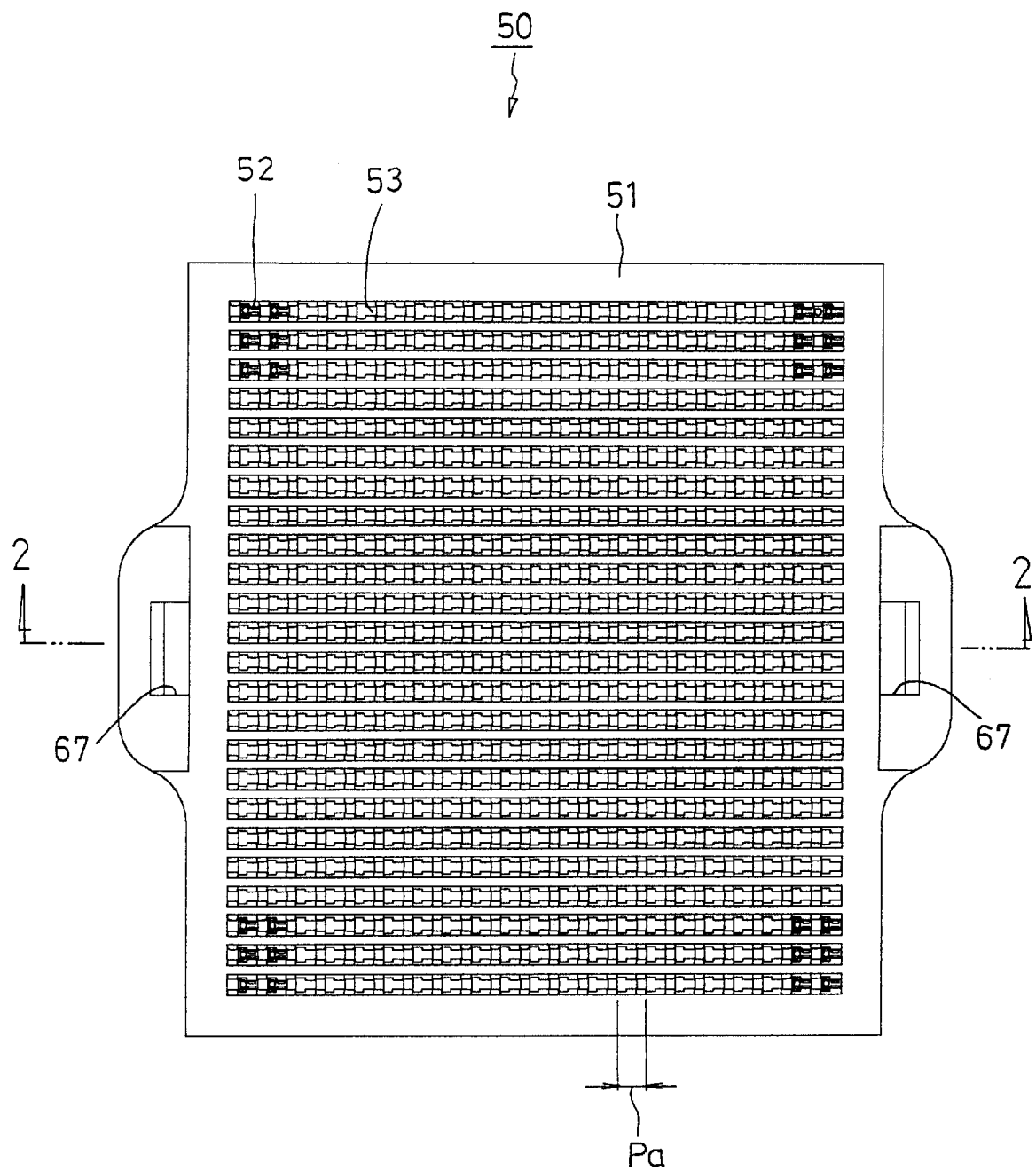
FIG. 1 is a top view of a first embodiment of the conductive members of the present invention, which are inserted in the insulating seat body.
Figure 2:
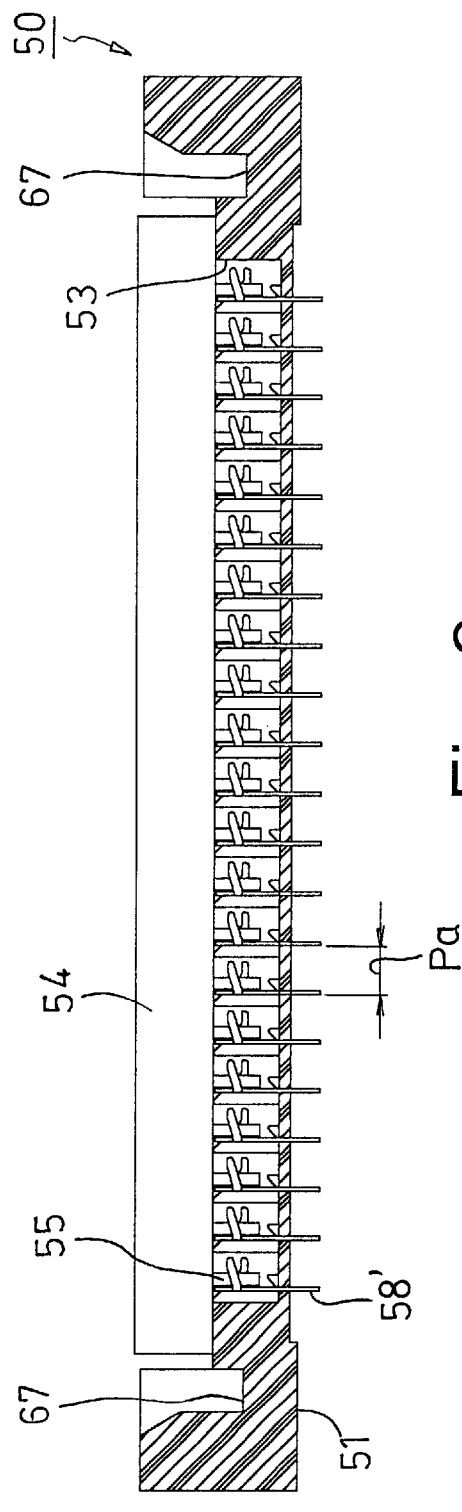
FIG. 2 is a sectional view taken along line 2—2 of FIG. 1.
Figure 3:
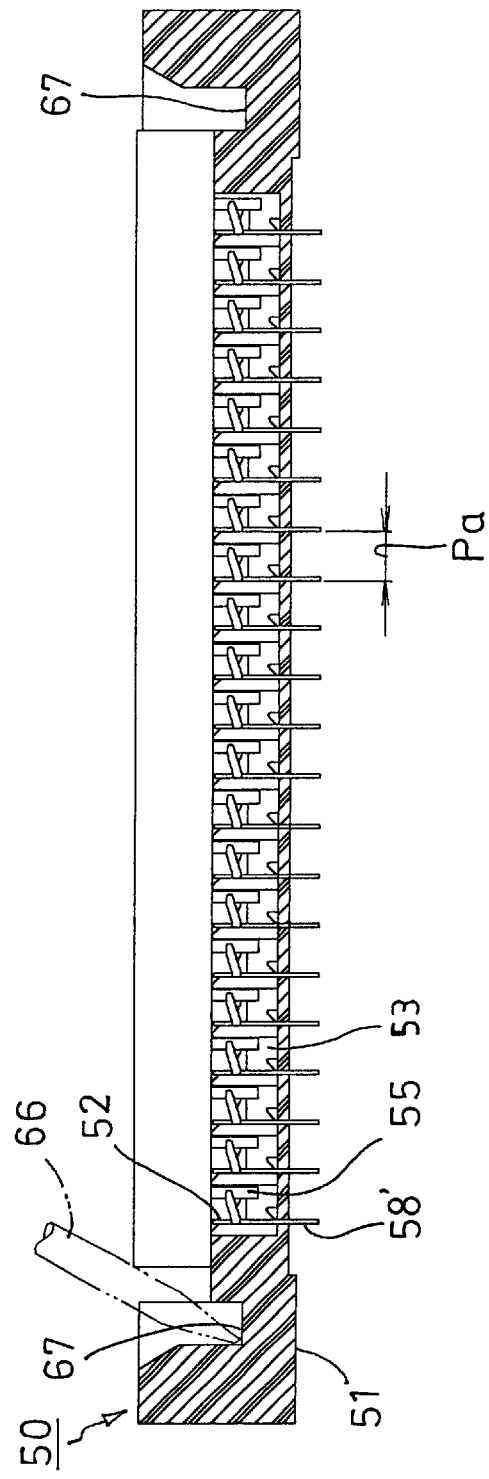
FIG. 3 is a sectional view according to FIG. 2, in which the insertion pins of the integrated circuit are moved to a contact position.
Figure 8:
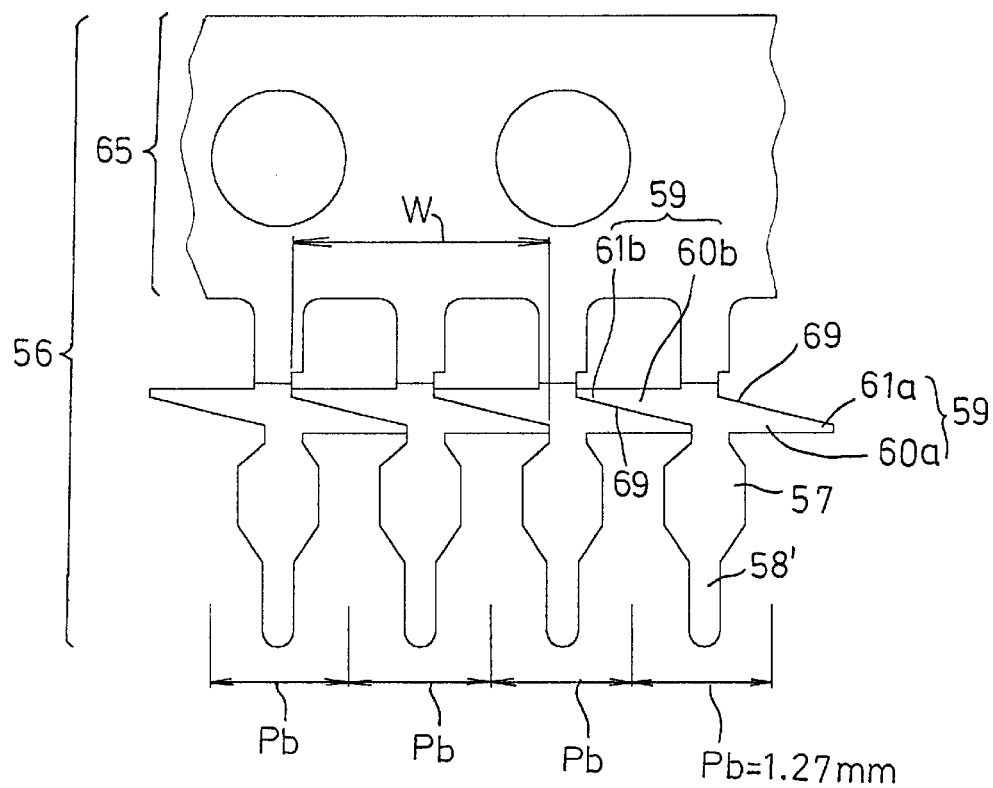
FIG. 8 is a plane view showing that a second embodiment of the conductive members are made by punching a blank.
Figure 11:
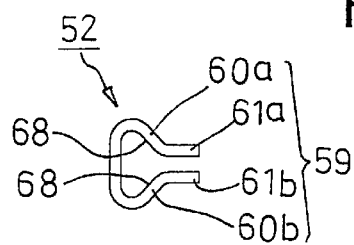
FIG. 11 is a top view of the second embodiment of the conductive member according to FIG. 10.
Figure 10:
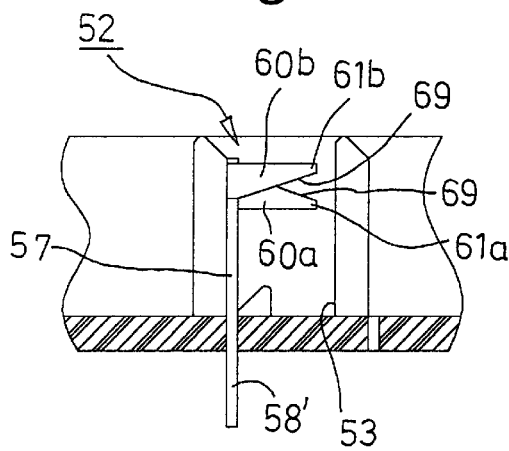
FIG. 10 is a sectional view showing that the conductive member of FIG. 9 is inserted in the insulating socket.
Figure 9:
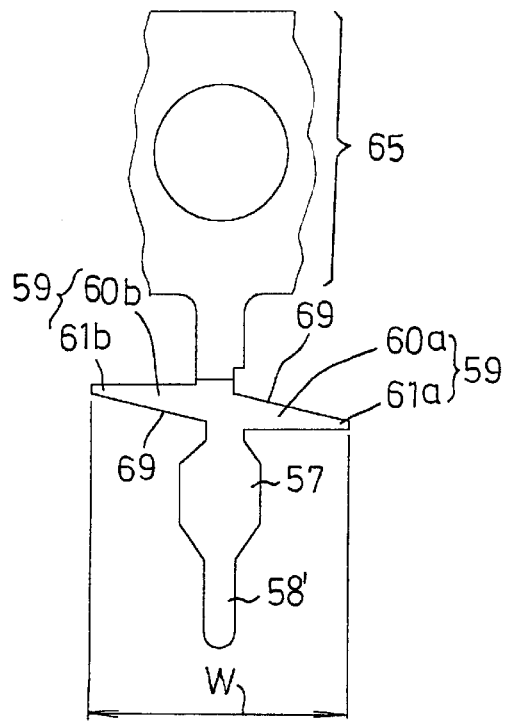
FIG. 9 shows one single conductive member taken from FIG. 8.
Figure 12:
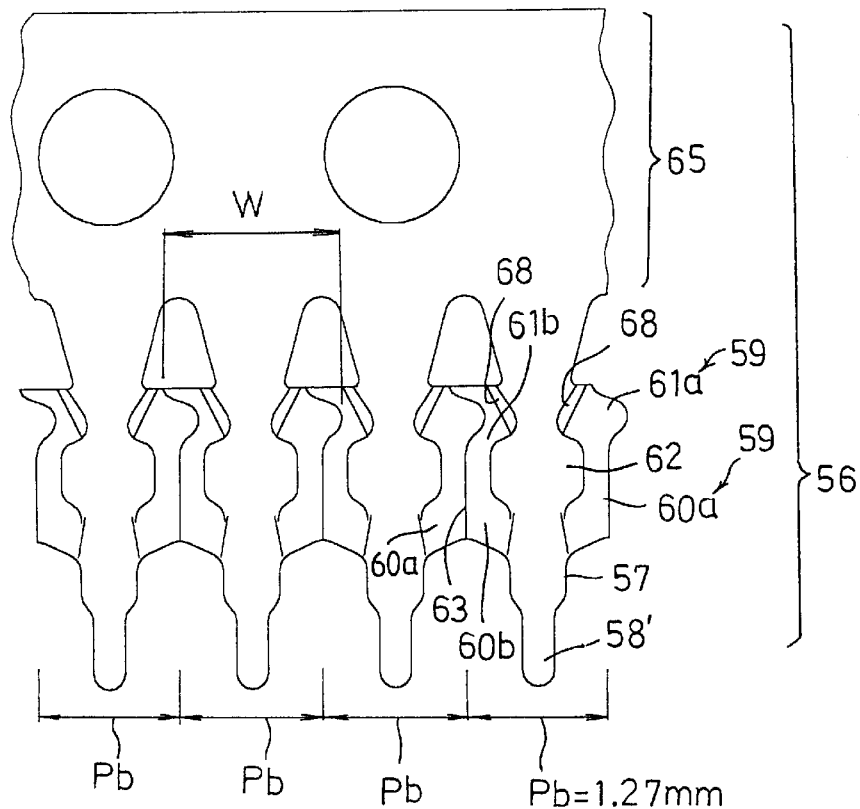
FIG. 12 is a plane view showing that a third embodiment of the conductive members are made by punching a blank.
Figure 16:
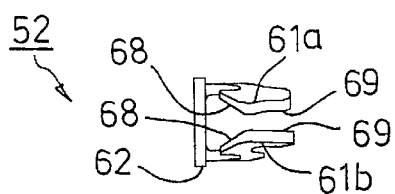
FIG. 16 is a top view of the third embodiment of the conductive member according to FIG. 14.
Figure 14:
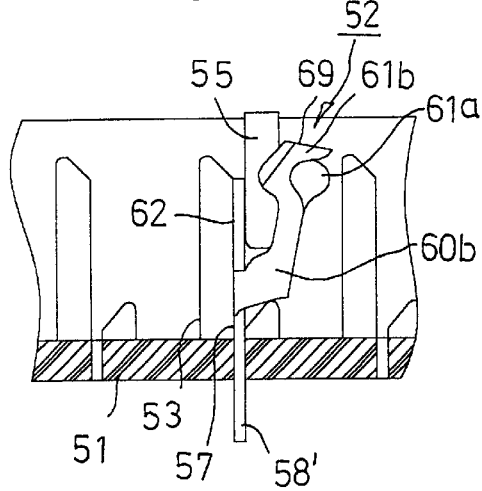
FIG. 14 is a sectional view showing that the conductive member of FIG. 13 is inserted in the insulating socket.
Figure 15:
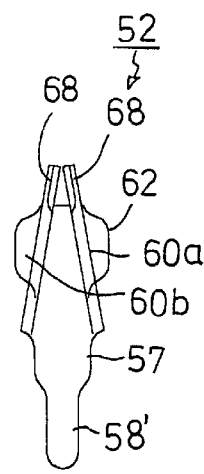
FIG. 15 is a front view of the third embodiment of the conductive member according to FIG. 14.
Figure 13:
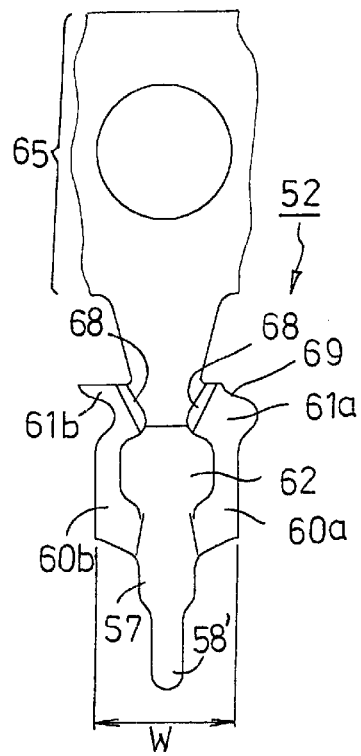
FIG. 13 shows one single conductive member taken from FIG. 12.
Figure 17:
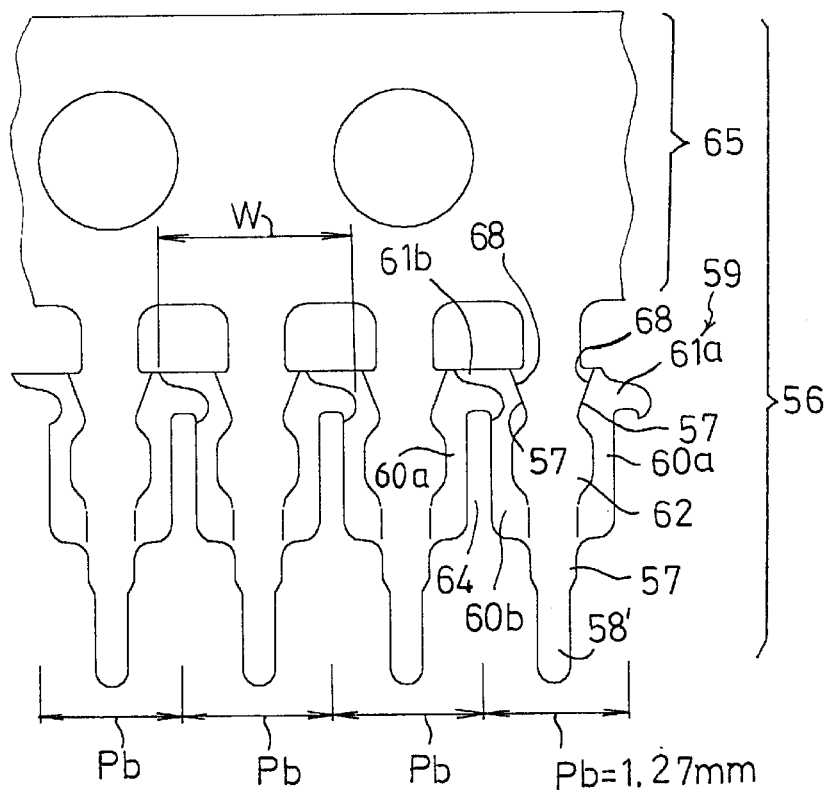
FIG. 17 is a plane view showing that a fourth embodiment of the conductive members are made by punching a blank.
Figure 21:
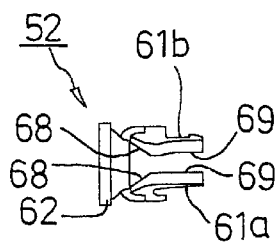
FIG. 21 is a top view of the fourth embodiment of the conductive member according to FIG. 19.
Figure 19:
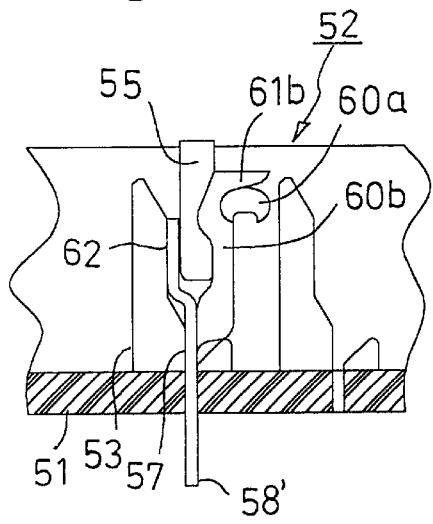
FIG. 19 is a sectional view showing that the conductive member of FIG. 18 is inserted in the insulating socket.
Figure 20:
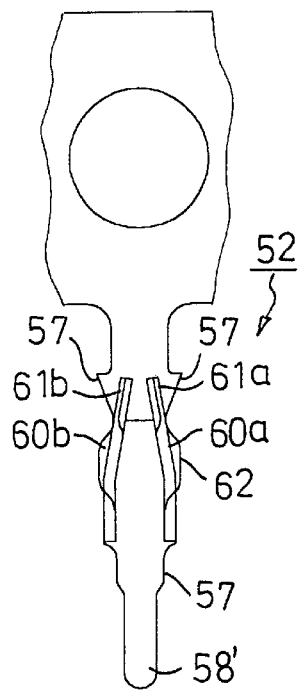
FIG. 20 is a right view of the fourth embodiment of the conductive member according to FIG. 19.
Figure 18:
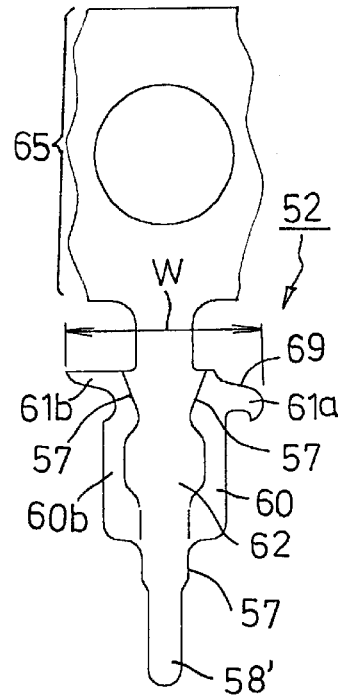
FIG. 18 shows one single conductive member taken from FIG. 17.
Figures 23, 24, 25:
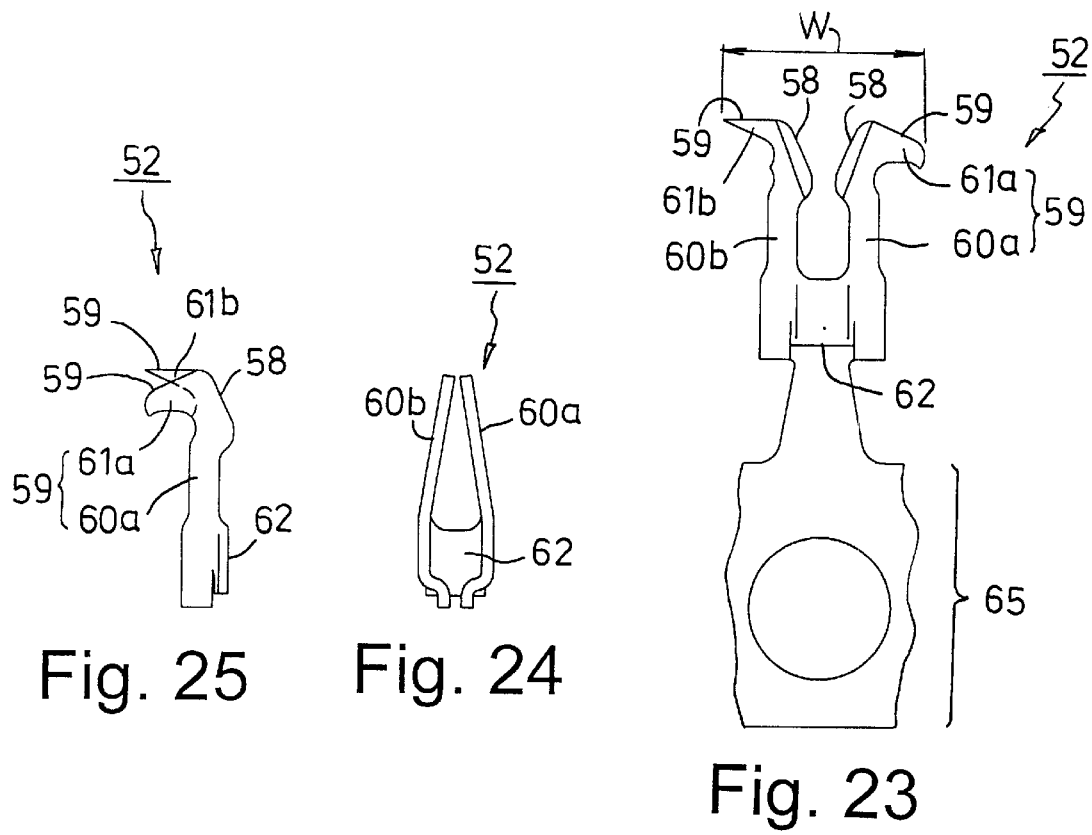
FIG. 23 shows one single conductive member taken from FIG. 22.
FIG. 24 is a rear view of the fifth embodiment of the conductive member according to FIG. 23.
FIG. 25 is a right view of the fifth embodiment of the conductive member according to FIG. 23.
Figure 22:
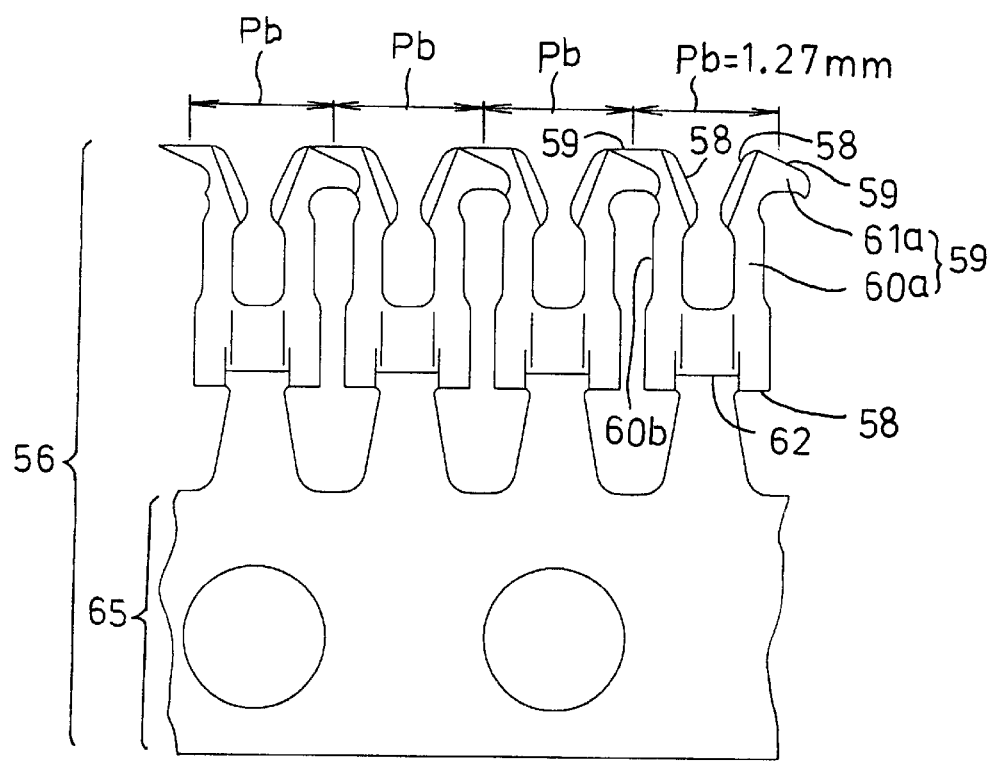
FIG. 22 is a plane view showing that a fifth embodiment of the conductive members are made by punching a blank.
Figure 29:
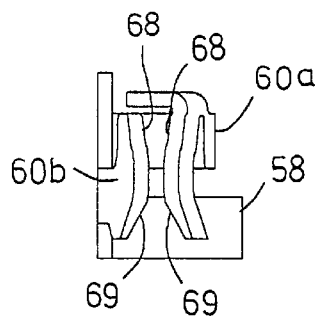
FIG. 29 is a top view of the sixth embodiment of the conductive member according to FIG. 27.
Figure 27:
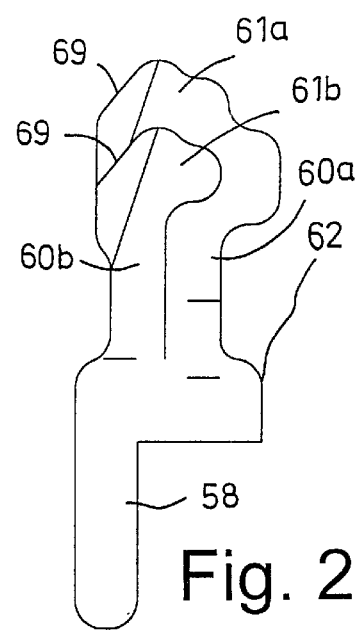
FIG. 27 shows one single conductive member taken from FIG. 26.
Figure 28:
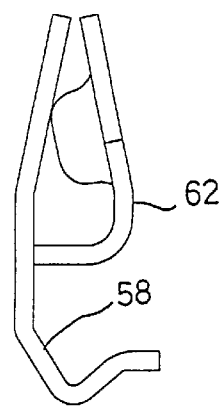
FIG. 28 is a front view of the sixth embodiment of the conductive member according to FIG. 27.
Figure 26:
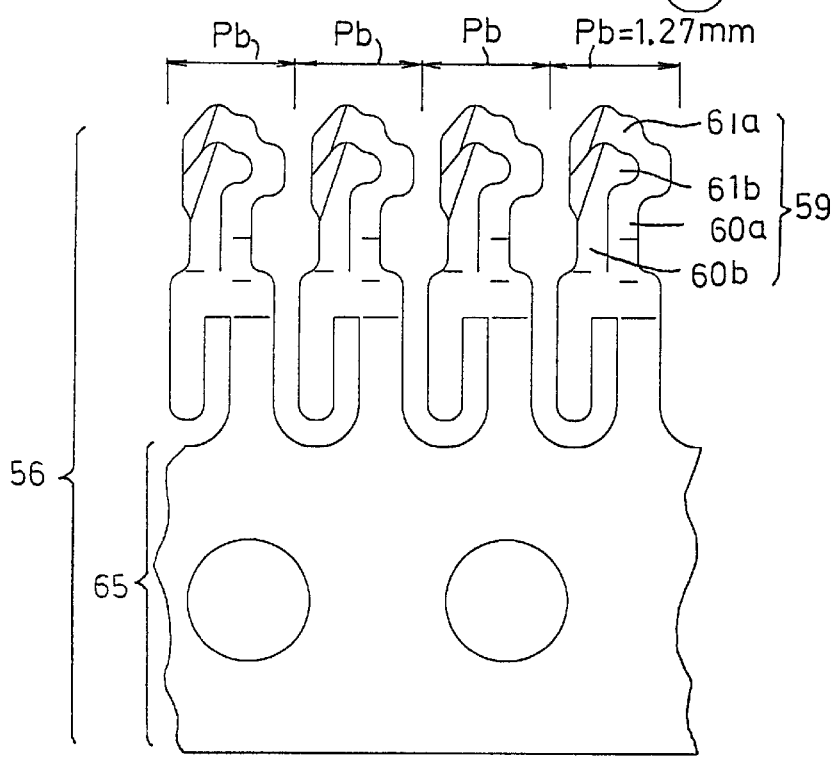
FIG. 26 is a plane view showing that a sixth embodiment of the conductive members are made by punching a blank.
Figure 34:
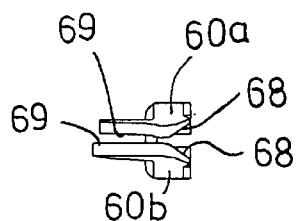
FIG. 34 is a top view of the seventh embodiment of the conductive member according to FIG. 31.
Figure 33:
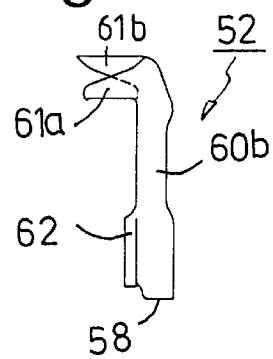
FIG. 33 is a left view of the seventh embodiment of the conductive member according to FIG. 31.
Figure 32:
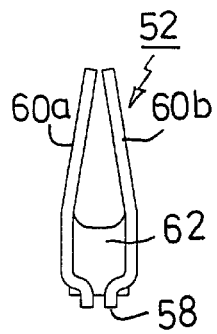
FIG. 32 is a front view of the seventh embodiment of the conductive member according to FIG. 31.
Figure 31:
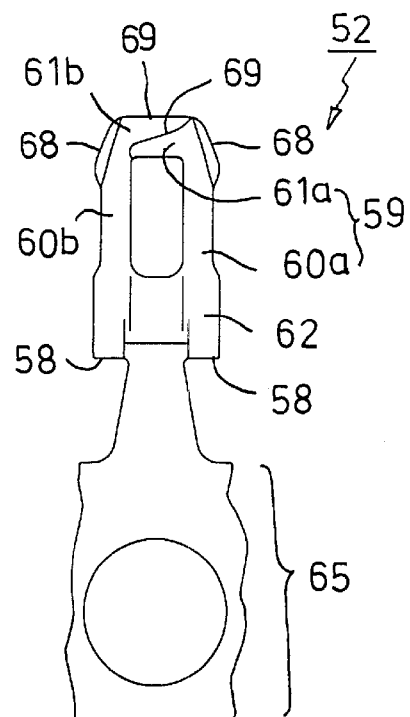
FIG. 31 shows one single conductive member taken from FIG. 30.
Figure 30:
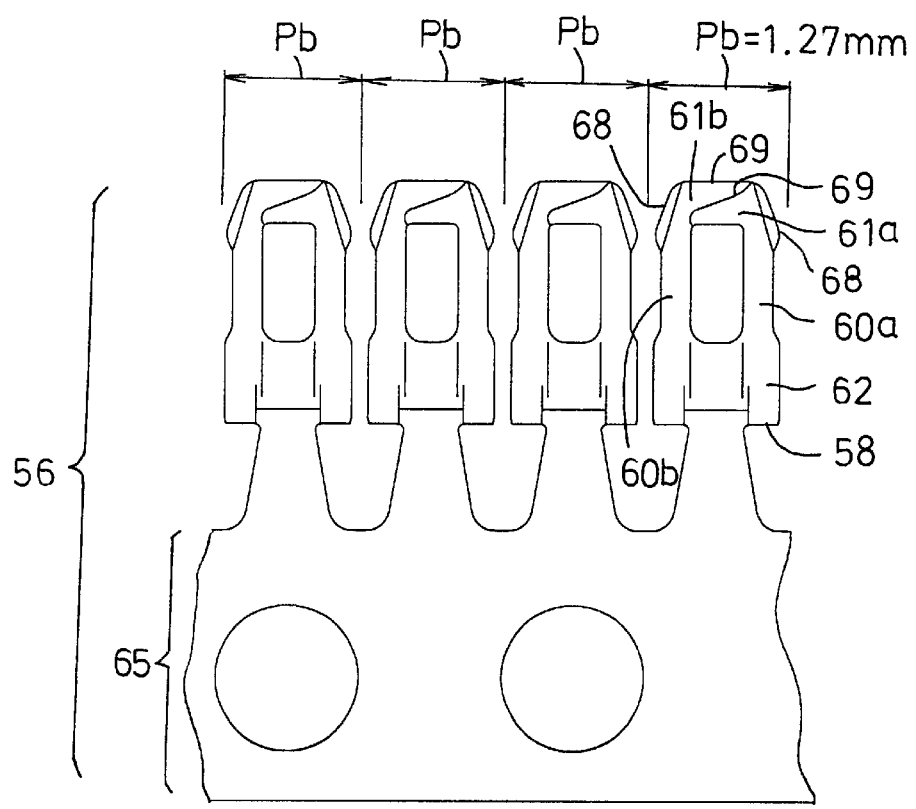
FIG. 30 is a plane view showing that a seventh embodiment of the conductive members are made by punching a blank.

Please refer to FIGS. 1 to 36, which show the conductive member 50 of zero insertion/extraction force integrated circuit socket of the present invention. The conductive member 50 includes an insulating seat body 51 and multiple conductive members 52. The insulating seat body 51 is formed with multiple insertion holes 53. The distance between any two adjacent insertion holes 53 is defined as an insertion pitch Pa.

The conductive members 52 are formed by cutting one single blank 63 and are sequentially arranged on the same blank 63 side by side. The pitch between any two adjacent conductive members 52 is defined as an unfolding pitch Pb. The conductive members 52 are respectively inserted in the insertion holes 53 of the insulating seat body 51, whereby the insertion pins 55 of the integrated circuit can be inserted into the conductive members 52.

Each conductive members 52 includes an insertion section 57, an electrically connecting section 58 and a clamping section 59. The insertion section 57 is inserted and fixed in the insertion hole 53 of the insulating body 51. The electrically connecting section 58 is inserted into the circuit board (not shown) to electrically connect therewith.

The clamping section 59 extends from the other end of the insertion section 57 in a direction opposite to the insertion section 57. An insertion pin 55 of the integrated circuit 54 is inserted in the clamping section 59. The clamping section 59 includes at least two spring sections 60a, 60b and at least two contact sections 61a, 61b. One end of each spring section 60a, 60b is integrally connected with the other end of the insertion section 57. The spring sections 60a, 60b are folded to resiliently clamp the insertion pin 55 of the integrated circuit 54.

One end of each contact section 61a, 61b is integrally connected with the other end of the spring section 60a, 60b. the spring sections 60a, 60b and the contact sections 61a, 61b are interlaced and arranged on the blank 56. The unfolding pitch Pb of the blank 56 is equal to the insertion pitch Pa, that is Pa=Pb=1.27 mm. Accordingly, a maximum utility ratio of the blank 56 is achieved. In addition, the conductive members 52, made by punching the same blank, can be fully inserted into the same row of insertion holes 53 of the insulating seat body 51 at the same time during the insertion operation. Moreover, with the unfolding pitch Pb of the blank 56 being equal to the insertion pitch Pa, in an unfolded state, the total width W of the contact sections 61a, 61b of the conductive member 52 is larger than the unfolding pitch Pb. That is, W>Pb; i.e., W>1.27 mm. This enables the blank 56 to be utilized to an optimal extent.

FIGS. 1 to 25 show first to fifth embodiments of the present invention. One of the spring sections 60a, 60b and contact sections 61a, 61b of any conductive member 52, or the spring sections 60a, 60b and the contact sections 61a, 61b, are interlaced with one of the contact sections 61a, 61b of an adjacent conductive member 52 and arranged on the blank 56. The unfolding pitch Pb of the blank 56 is equal to the insertion pitch Pa. That is, Pa=Pb=1.27 mm. Accordingly, a maximum utility ratio of the blank 56 is achieved. In addition, the conductive members 52, made by punching the same blank, can be fully inserted into the same row of insertion holes 53 of the insulating seat body 51 at the same time during the insertion operation.

FIGS. 1 to 7 show a first embodiment of the present invention. The spring sections 60a, 60b and the contact sections 61a, 61b of each conductive member 52, respectively, extend along two opposed sides and deflect away from each other. One of the spring sections 60a, 60b and contact sections 61a, 61b of any conductive member 52 are interlaced with one of the contact sections 61a, 61b of an adjacent conductive member 52 and arranged on the blank 56. After the spring sections 60a, 60b and the contact sections 61a, 61b of each conductive member 52 are cut from the blank 56, they are bent toward the middle into an opposed state, as shown in FIGS. 6 and 7. In addition, the conductive member 52 of FIGS. 1 to 7 further includes an auxiliary insertion section 62 which integrally extends from the other end of the clamping section 59 and is fixedly inserted in the insertion hole 53 of the insulating seat body 51. By means of the insertion section 57 and the auxiliary insertion section 62, the conductive member is fixed in the insertion hole 53 of the insulating seat body 51.

FIGS. 8 to 11 show a second embodiment of the present invention. Similar to the first embodiment of FIGS. 1 to 7, the spring sections 60a, 60b and the contact sections 61a, 61b of each conductive member 52 respectively extend along two opposed sides and deflect away from each other.

One of the spring sections 60a, 60b and contact sections 61a, 61b of any conductive member 52 are interlaced with one of the contact sections 61a, 61b of an adjacent conductive member 52 and are arranged on the blank 56. An insertion leg 58' extends from the insertion section 57 and is inserted into the circuit board (not shown) to electrically connect therewith. However, the second embodiment lacks the auxiliary insertion section 62 so that the height of the conductive member 52 is shortened for application to notebook-type or handheld computers, which demand thinness.

FIGS. 12 to 16 show a third embodiment of the present invention, which is similar to the first embodiment of FIGS. 1 to 7. However, the spring sections 60a, 60b extend from a lower portion of the conductive member 52 so that the spring sections 60a, 60b are longer. This increases the extent to which the spring sections 60a, 60b are resiliently moved. In addition, the spring sections 60a, 60b are resiliently moved along an upright direction. In contrast, the spring sections 60a, 60b of the first embodiment extend from a higher portion of the conductive member 52, whereby the spring sections 60a, 60b are resiliently moved along a horizontal direction. In addition, each of the contact sections 61a, 61b of the conductive member 52 of the third embodiment has a first slope 68 which first contacts with the insertion pin 55 of the integrated circuit. The first slope 68 serves to guide the insertion pin 55 to easily slide into the space between the opposite contact sections 61a and 61b. Each of the contact sections 61a, 61b of the conductive member 52 has a second slope 69 which further contacts with the insertion pin 55 of the integrated circuit. The second slope 67 serves to prevent the insertion pin 55 from slipping out of the space between the opposite contact sections 61a and 61b. Accordingly, the insertion pin 55 of the integrated circuit is more firmly clamped and fixed.

FIGS. 17 to 21 show a fourth embodiment of the present invention, which is similar to the third embodiment of FIGS. 12 to 16. However, in the third embodiment, one contact section 61a of the conductive member 52 is immediately adjacent one contact section 61b of the adjacent conductive member 52 along a slit 63. In addition, one spring section 60a of the conductive member 52 is adjacent one spring section 60b of the adjacent conductive member 52 along a slit 63. In contrast, in the fourth embodiment, only one contact section 61a of the conductive member 52 is immediately adjacent one contact section 61b of the adjacent conductive member 52 along a slit 63, while one spring section 60a of the conductive member 52 is separated from one spring section 60b of the adjacent conductive member 52 by a cut way 64.

FIGS. 22 to 25 show a fifth embodiment of the present invention, which is similar to the fourth embodiment of FIGS. 17 to 21. However, in the fifth embodiment, the electrically connecting section 58 of the conductive member 52 lacks any insertion leg 58' and directly contacts with the circuit board (not shown) and electrically connects therewith. In the fourth embodiment of FIGS. 17 to 21, the electrically connecting section 58 has an insertion leg 58' extending from the insertion section 57. The insertion leg 58' is inserted into the circuit board to electrically connect therewith. In addition, in the fifth embodiment, the blank bank section 65 of the blank 56 is connected with the bottom end of the insertion section 57 of the conductive member 52. In contrast, in the fourth embodiment, the blank band section 65 of the blank 56 is connected with the top end of the auxiliary insertion section 57 of the conductive member 52.

FIGS. 26 to 36 show sixth and seventh embodiments of the present invention. The spring sections 60a, 60b and contact sections 61a, 61b of the same conductive member 52 are interlaced with each other and are arranged on the blank 56 within the same unfolding pitch Pb. Therefore, the conductive member 52 can be cut within the same unfolding pitch Pb (Pb=1.27 mm) and the unfolding pitch Pb of the blank 56 is equal to the insertion pitch Pa. (Pa=Pb=1.27 mm) Accordingly, a maximum utility ratio of the blank 56 is achieved. In addition, the conductive members 52, made by punching the same blank, can be fully inserted into the same row of insertion holes 53 of the insulating seat body 51 at the same time during the insertion operation.

FIGS. 26 to 29 show the sixth embodiment of the present invention. The spring sections 60a, 60b and contact sections 61a, 61b are bent and tightly interlaced with each other. In addition, the electrically connecting section 58 has an insertion leg 58' extending from the insertion section 62. However, the insertion leg 58' is not inserted into the circuit board. Instead, the insertion leg 58' is bent to resiliently contact with the circuit board (not shown) and electrically connect therewith.

FIGS. 30 to 36 show the seventh embodiment of the present invention. In an unfolded state, the seventh embodiment is very similar to the fifth embodiment of FIGS. 22 to 25. However, they have quite different structures. In the fifth embodiment, in an unfolded state, the spring sections 60a, 60b and contact sections 61a, 61b are interlaced with one of the contact sections 61a, 61b of an adjacent conductive member 52 and are arranged on the blank 56. However, in the seventh embodiment of FIGS. 30 to 36, the spring sections 60a, 60b and contact sections 61a, 61b are interlaced with each other and arranged on the blank 56 within the same unfolding pitch Pb of the blank 56. That is, the spring sections 60a, 60b and contact sections 61a, 61b of the same conductive member 52 are interlaced with each other.

Figure 35:
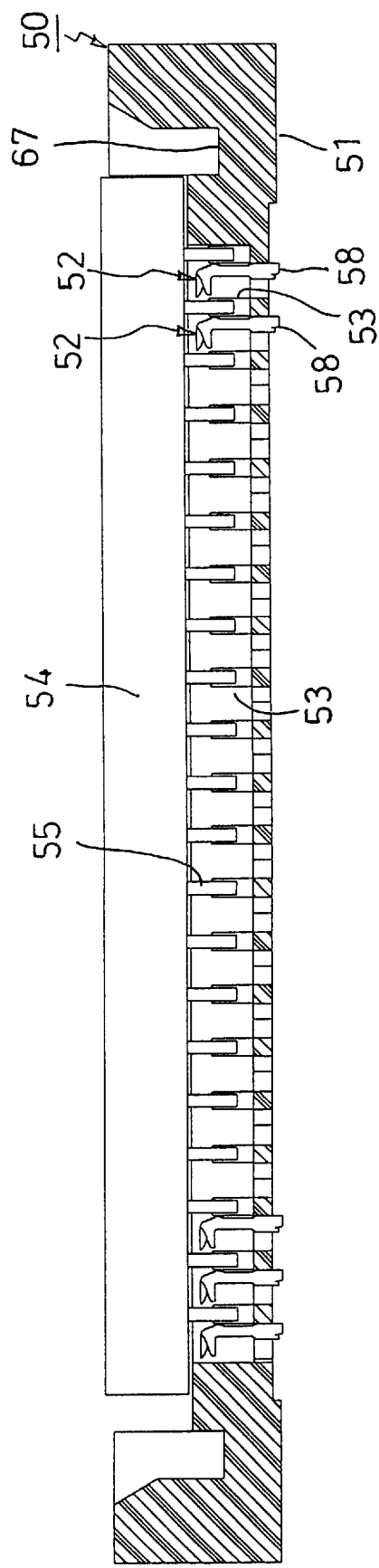
FIG. 35 is a sectional view showing that the conductive member of FIG. 31 is inserted in the insulating seat body.
Figure 36:
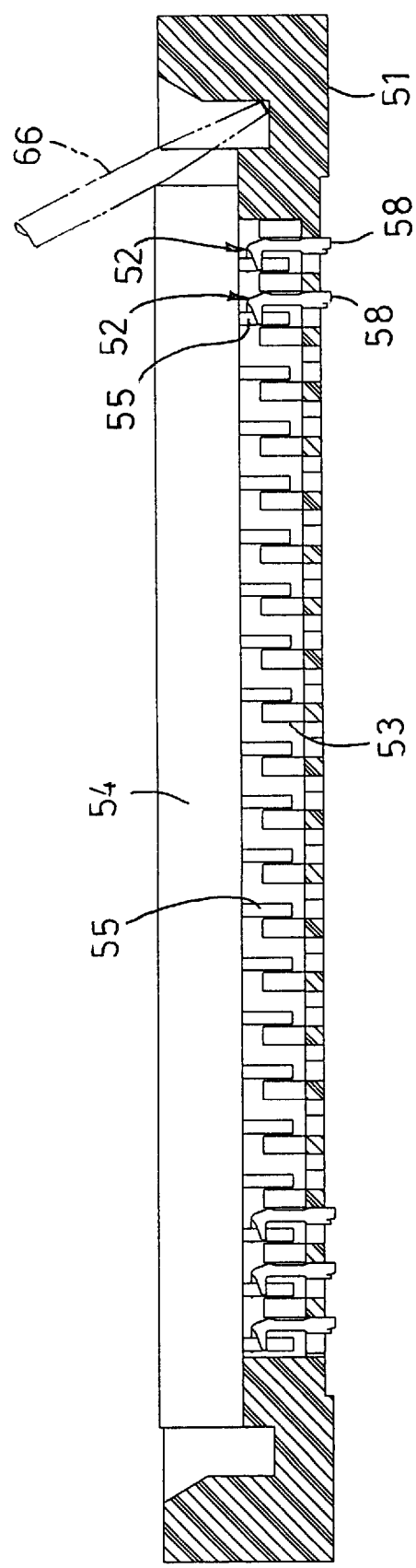
FIG. 36 is a sectional view according to FIG. 35, in which the insertion pins of the integrated circuit are moved to a contact position.
Figure 37:
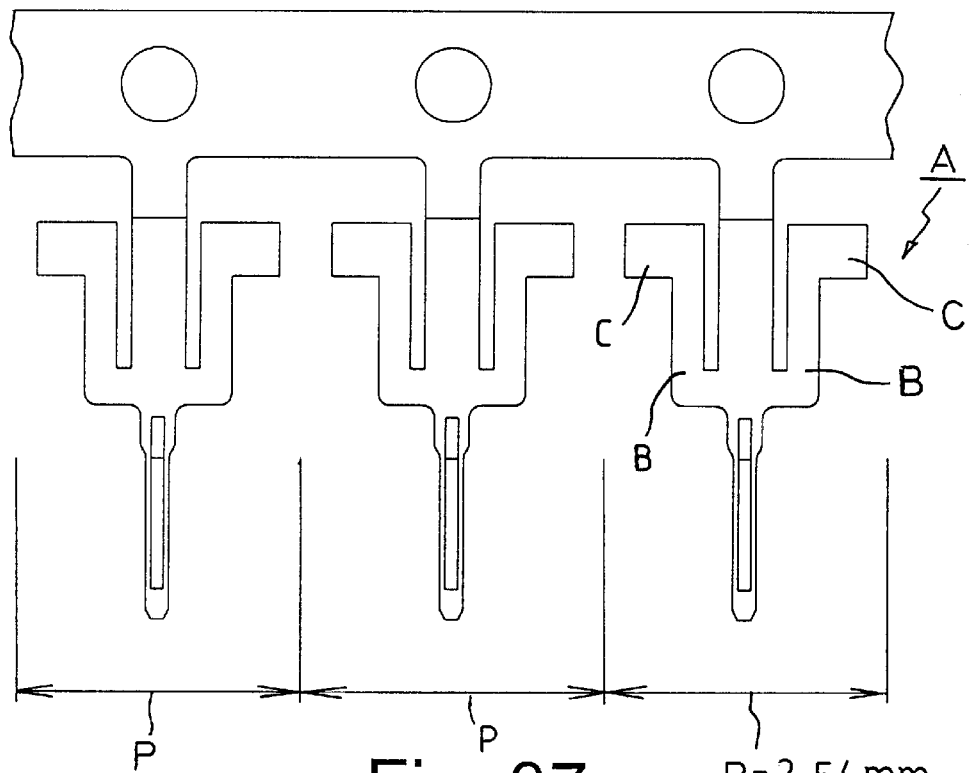
FIG. 37 is a plane unfolded view showing that each conventional conductive member is cut at two unfolding pitches.
Figure 39:
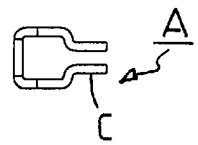
FIG. 39 is a top view of the conventional conductive member of FIG. 38 in a folded state.
Figure 38:
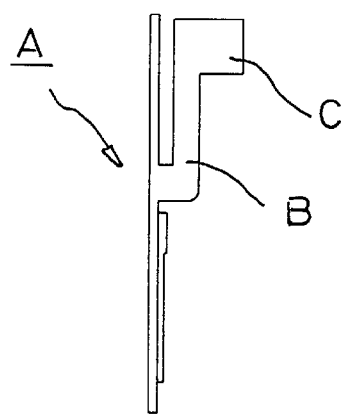
FIG. 38 is a side view of the conventional conductive member of FIG. 37 in a folded state.

As shown in FIG. 35, the insertion pin 55 of the integrated circuit 54 is inserted into the insertion hole 53 of the insulating seat body 51, but does not contact the contact sections 61a and 61b of the conductive member 52. Then, a screwdriver 66 is inserted into a fulcrum dent 67 and biased leftward to move the integrated circuit 54 leftward. Accordingly, the insertion pin 55 of the integrated circuit 54 is guided by the first slopes 68 of the contact sections 61a and 61b to smoothly slide into the space between the contact sections 61a and 61b, as shown in FIG. 36. The second slopes 69 at the other ends of the contact sections 61a and 61b forcibly push the insertion pin 55 so as to effectively prevent the insertion pin 55 from slipping out of the space between the contact sections 61a and 61b. Accordingly, the insertion pin 55 of the integrated circuit is more firmly clamped and fixed.

According to the above arrangement, the present invention has the following advantages:

1. The spring sections and contact sections of the conductive members are interlaced with each other and are arranged on the blank. The unfolding pitch of the blank is equal to the insertion pitch and a complete conductive member can be cut within each 1.27 mm pitch. The conductive members made by punching the same blank can be fully inserted into the same row of insertion holes of the insulating seat body at the same time during the insertion operation.

2. A complete conductive member can be cut within each 1.27 mm pitch. Accordingly, a maximum utility ratio of the blank is achieved.

3. Each of the contact sections of any conductive member has a first slope which first contacts with the insertion pin of the integrated circuit. The first slope serves to guide the insertion pin to be easily pushed and clamped in the space between the opposite contact sections.

4. Each of the contact sections of any conductive member has a second slope which further contacts the insertion pin of the integrated circuit. The second slope serves to prevent the insertion pin from slipping out of the space between the contact sections. Accordingly, the insertion pin of the integrated circuit is more firmly clamped and fixed.

The above embodiments are only used to illustrate the present invention, not intended to limit the scope thereof. Many modifications of the above embodiments can be made without departing from the spirit or scope of the present invention.

What is claimed is:

1. A conductive member of zero insertion/extraction force integrated circuit socket, comprising:
    an insulating seat body having a plurality of insertion holes formed therethrough, a distance between any two adjacent insertion holes being defined as an insertion pitch; and,
    a plurality of conductive members formed by cutting a single blank and being sequentially and adjacently arranged on said blank, the distance between any two adjacent conductive members being defined as an unfolding pitch, the conductive members being respectively inserted in the insertion holes of the insulating seat body, whereby insertion pins of the integrated circuit can be inserted into the conductive members, each conductive member including an insertion section inserted and fixed in the insertion hole of the insulating seat body, an electrically connecting section extending from one end of the insertion section for electrically connecting with a circuit board and a clamping section, one end of the clamping section extending from the other end of the insertion section in a direction opposed to the direction of the insertion section for an insertion pin of the integrated circuit to insert therein, the clamping section including at least two spring sections and at least two contact sections, one end of each spring section being integrally connected with the other end of the insertion section, the spring sections being folded, one end of each contact section being integrally connected with the other end of the spring section, the spring sections and the contact sections being interlaced with each other and arranged on the blank, the unfolding pitch of the blank being equal to the insertion pitch, whereby a maximum utility ratio of the blank is achieved and the conductive members can be fully inserted into the same row of insertion holes of the insulating seat body at the same time during the insertion operation.

2. The conductive member of zero insertion/extraction force integrated circuit socket as claimed in claim 1, wherein one of the spring sections and contact sections of any conductive member, of the spring sections and contact sections of the conductive member, are interlaced with one of the contact sections of an adjacent conductive member and arranged on the blank, the unfolding pitch of the blank being equal to the insertion pitch, whereby a maximum utility ratio of the blank is achieved and the conductive members can be fully inserted into the same row of insertion holes of the insulating seat body at the same time during the insertion operation.

3. The conductive member of zero insertion/extraction force integrated circuit socket as claimed in claim 2, wherein the conductive member further comprises an auxiliary insertion section which integrally extends from the other end of the clamping section for fixed insertion into the insertion hole of the insulating seat body.

4. The conductive member of zero insertion/extraction force integrated circuit socket as claimed in claim 2, wherein one spring section of the conductive member is adjacent to one contact section of an adjacent conductive member along a slit.

5. The conductive member of zero insertion/extraction force integrated circuit socket as claimed in claim 2, wherein one spring section of the conductive member is separated from one contact section of an adjacent conductive member by a cut way.

6. The conductive member of zero insertion/extraction force integrated circuit socket as claimed in claim 1, wherein the spring sections and contact sections of a single conductive member are interlaced with each other and arranged on the blank within the same unfolding pitch, whereby the conductive member can be cut within the same unfolding pitch and the unfolding pitch of the blank is equal to the insertion pitch so that a maximum utility ratio of the blank is achieved and the conductive members can be fully inserted into the same row of insertion holes of the insulating seat body at the same time during the insertion operation.

7. The conductive member of zero insertion/extraction force integrated circuit socket as claimed in claim 6, wherein one spring section of the conductive member is adjacent to one contact section of an adjacent conductive member along a slit.

8. The conductive member of zero insertion/extraction force integrated circuit socket as claimed in claim 6, wherein one spring section of the conductive member is separated from one contact section of an adjacent conductive member by a cut way.

9. The conductive member of zero insertion/extraction force integrated circuit socket as recited in claim 1, wherein each of the contact sections of a conductive member has a first slope which contacts with the insertion pin of the integrated circuit, the first slope serving to guide the insertion pin to easily slide into the space between the opposite contact sections.

10. The conductive member of zero insertion/extraction force integrated circuit socket as recited in claim 2, wherein each of the contact sections of a conductive member has a first slope which contacts with the insertion pin of the integrated circuit, the first slope serving to guide the insertion pin to easily slide into the space between the opposite contact sections.

11. The conductive member of zero insertion/extraction force integrated circuit socket as recited in claim 3, wherein each of the contact sections of a conductive member has a first slope which contacts with the insertion pin of the integrated circuit, the first slope serving to guide the insertion pin to easily slide into the space between the opposite contact sections.

12. The conductive member of zero insertion/extraction force integrated circuit socket as recited in claim 4, wherein each of the contact sections of a conductive member has a first slope which contacts with the insertion pin of the integrated circuit, the first slope serving to guide the insertion pin to easily slide into the space between the opposite contact sections.

13. The conductive member of zero insertion/extraction force integrated circuit socket as recited in claim 5, wherein each of the contact sections of a conductive member has a first slope which contacts with the insertion pin of the integrated circuit, the first slope serving to guide the insertion pin to easily slide into the space between the opposite contact sections.

14. The conductive member of zero insertion/extraction force integrated circuit socket as recited in claim 6, wherein each of the contact sections of a conductive member has a first slope which contacts with the insertion pin of the integrated circuit, the first slope serving to guide the insertion pin to easily slide into the space between the opposite contact sections.

15. The conductive member of zero insertion/extraction force integrated circuit socket as recited in claim 7, wherein each of the contact sections of a conductive member has a first slope which contacts with the insertion pin of the integrated circuit, the first slope serving to guide the insertion pin to easily slide into the space between the opposite contact sections.

16. The conductive member of zero insertion/extraction force intergrated circuit socket as recited in claim 8, wherein each of the contact sections of a conductive member has a first slope which contacts with the insertion pin of the integrated circuit, the first slope serving to guide the insertion pin to easily slide into the space between the opposite contact sections.

17. The conductive member of zero insertion/extraction force integrated circuit socket as recited in claim 1, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

18. The conductive member of zero insertion/extraction force integrated circuit socket as recited in claim 2, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

19. The conductive member of zero insertion/extraction force integrated circuit socket as recited in claim 3, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

20. The conductive member of zero insertion/extraction force integrated circuit socket as recited in claim 4, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

21. The conductive member of zero insertion/extraction force integrated circuit socket as recited in claim 5, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

22. The conductive member of zero insertion/extraction force integrated circuit socket as recited in claim 6, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

23. The conductive member of zero insertion/extraction force integrated circuit socket as recited in claim 7, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

24. The conductive member of zero insertion/extraction force integrated circuit socket as recited in claim 8, wherein each of the contact sections of a conductive member has a second slope which contacts with the insertion pin of the integrated circuit, the second slope serving to prevent the insertion pin from slipping out of the space between the contact sections, whereby the insertion pin of the integrated circuit is more firmly clamped and fixed.

25. A conductive member of zero insertion/extraction force integrated circuit socket, comprising:
    an insulating seat body having a plurality of insertion holes formed therethrough; and,
    a plurality of conductive members formed by cutting a single blank and being sequentially and adjacently arranged on said blank, the conductive members being respectively inserted in the insertion holes of the insulating seat body for insertion pins of the integrated circuit to insert therein, each conductive member including an insertion section inserted and fixed in the insertion hole of the insulating seat body, an electrically connecting section extending from one end of the insertion section for electrically connecting with a circuit board and a clamping section, one end of the clamping section extending from the other end of the insertion section in a direction opposed to the insertion section for an insertion pin of the integrated circuit to insert therein, the clamping section including at least two spring sections and at least two contact sections, one end of each spring section being integrally connected with the other end of the insertion section, the spring sections being folded, one end of each contact section being integrally connected with the other end of the spring section, the spring sections and the contact sections being interlaced with each other and arranged on the blank, whereby a minimum width of the blank is cut to form spring sections and contact sections having a maximum width so that a maximum utility ratio of the blank is achieved.

* * * * *